(12) United States Patent
Kim

(10) Patent No.: US 7,432,182 B2
(45) Date of Patent: Oct. 7, 2008

(54) SEMICONDUCTOR DEVICE AND METHOD FOR MANUFACTURING THE SAME

(75) Inventor: Seok-Su Kim, Icheon-si (KR)

(73) Assignee: Dongbu Electronics Co. Ltd., Seoul (KR)

( * ) Notice: Subject to any disclaimer, the term of this patent is extended or adjusted under 35 U.S.C. 154(b) by 351 days.

(21) Appl. No.: 11/186,397

(22) Filed: Jul. 21, 2005

(65) Prior Publication Data

US 2006/0019450 A1 Jan. 26, 2006

(30) Foreign Application Priority Data

Jul. 26, 2004 (KR) .................... 10-2004-0058191

(51) Int. Cl.
*H01L 21/3205* (2006.01)
(52) U.S. Cl. .................... 438/586; 438/300
(58) Field of Classification Search ................ 438/586, 438/607, 637, 300
See application file for complete search history.

(56) References Cited

U.S. PATENT DOCUMENTS

| | | | |
|---|---|---|---|
| 5,858,837 A | 1/1999 | Sakoh et al. | |
| 6,030,894 A | 2/2000 | Hada et al. | |
| 6,107,182 A | 8/2000 | Asahina et al. | |
| 6,287,905 B2 | 9/2001 | Kim et al. | |
| 6,432,816 B2 | 8/2002 | Kim et al. | |
| 6,472,303 B1 | 10/2002 | Weon et al. | |
| 6,869,874 B2 * | 3/2005 | Kim et al. | 438/652 |
| 6,881,659 B2 | 4/2005 | Park et al. | |
| 2004/0102039 A1 | 5/2004 | Lim et al. | |

FOREIGN PATENT DOCUMENTS

| | | | |
|---|---|---|---|
| KR | 10-1998-055929 | * | 9/1998 |
| KR | 10-0426490 | * | 3/2004 |
| KR | 1020040029539 A | | 4/2004 |
| KR | 10-0474546 | * | 2/2005 |
| KR | 10-0535030 | * | 12/2005 |

OTHER PUBLICATIONS

Kim, Ji Yoong, Contact Plug Structure of Semiconductor Device and Forming Method Thereof, English Abstract of Koroan Patent 1020040028539 A, Apr. 8, 2004, Korean Intellectual Property Office, Republic of Korea.

Kim, Jeong Ho et al., Method for Fabricating Semiconductor Device, English Abstract of Korean Patent Abstract 1020010063782 A, Jul. 9, 2001, Korean Intellectual Property Office, Republic of Korea.

(Continued)

*Primary Examiner*—Mark Prenty
(74) *Attorney, Agent, or Firm*—Andrew D. Fortney

(57) ABSTRACT

An exemplary method for manufacturing a semiconductor device includes: forming an insulating layer over a semiconductor substrate having a gate insulating layer, a gate, and a spacer, respectively formed thereabove and one or more junction regions formed therein so as to fill a full height of a gap between gates; forming a contact hole partially exposing the junction region(s) by etching the insulating layer; and selectively forming a silicon layer on an exposed portion of the junction region at a bottom of the contact hole.

15 Claims, 4 Drawing Sheets

OTHER PUBLICATIONS

Kim, Joong Ho et al., Method for Manufacturing Semiconductor Device, English Abstract of Korean Patent Abstract 1020010063759 A, Jul. 9, 2001, Korean Intellectual Property Office, Republic of Korea.

Lee, Young-Cheol et al., Method of Forming Contact Hole In Semiconductor Device, English Abstract of Korean Patent 1019980055929 A, Sep. 25, 1998, Korean Intellectual Property Office, Republic of Korea.

* cited by examiner

US 7,432,182 B2

SEMICONDUCTOR DEVICE AND METHOD FOR MANUFACTURING THE SAME

CROSS-REFERENCE TO RELATED APPLICATION

This application claims priority to and the benefit of Korean Patent Application 10-2004-058191 filed in the Korean Intellectual Property Office on Jul. 28, 2004, the entire contents of which are incorporated herein by reference. Furthermore, this application may be related to U.S. application No. 11/186,396 filed contemporaneously herewith and incorporated herein by reference in its entirety.

BACKGROUND OF THE INVENTION (a) Field of the Invention

The present invention relates to a semiconductor device and a method for manufacturing the same. More particularly, the present invention relates to a contact hole of a semiconductor device and a method for manufacturing the same.

(b) Description of the Related Art

Typically, a semiconductor device is insulated from another semiconductor device or an exterior circuit. For an electrical connection thereof, a contact hole is formed in an insulating layer, and a conductive material such as a metal fills the contact hole.

However, integrated circuit design rule dimensions decrease as Integration of semiconductor devices Increases, and thus, gaps between semiconductor device (or integrated circuit) patterns are reduced. Accordingly, contact hole aspect ratios also increase as integration of semiconductor devices increases.

Typically, a contact hole is formed by etching the insulating layer, and a contact failure may result when the insulating layer is not fully etched (e.g., such that part of the Insulating layer remains at the bottom of the contact hole). Therefore, a contact hole etching process may be performed to provide an overcut etch profile so as to prevent such a contact failure.

Hereinafter, a conventional method for forming a contact hole will be described in detail with reference to FIG. 1, FIG. 2A, and FIG. 2B.

Firstly, as shown In FIG. 1 and FIG. 2A a gate Insulating layer 11, a gate 12, and an Insulating spacer 13 are formed above a semiconductor substrate 10, and a source/drain junction region 14 is formed in the substrate 10. Then, a flowable interlayer insulating layer 15 such as a borophosphosilicate glass (BPSG) layer or a phosphosilicate glass (PSG) layer is formed over the substrate so as to fill the gap between the gates 12.

Subsequently, as shown in FIG. 2B (and in part in FIG. 1), the interlayer insulating layer 15 is etched to form a contact hole 16 partially exposing the junction region 14. In this case, the interlayer insulating layer 15 is performed such that contact hole 18 has an overcut etch profile and becomes fully open.

However, when the contact hole 16 has an overcut profile, the junction region 14 is also at least partially etched (although the contact hole 16 may become fully open without a remaining part of the interlayer insulating layer 15 at the bottom of the contact hole 16). Therefore, a thickness D1 from a contact surface at the bottom of the contact hole 16 to a bottom of the junction region 14 Is reduced, and accordingly, a contact resistance characteristic of a wire contacting the junction region 14 through the contact hole 16 may become substantially deteriorated.

The above information disclosed in this Background section is only for enhancement of understanding of the background of the invention, and therefore It may contain information that does not form information (e.g., prior art) that may be already known In this or any other country to a person of ordinary skill in the art.

SUMMARY OF THE INVENTION

The present Invention has been made in an effort to prevent a contact failure by enabling full openness of a contact hole and to enhance a contact resistance characteristic of a wire at the same time.

An exemplary semiconductor device according to an embodiment of the present invention includes: a semiconductor substrate; a gate and a gate insulating layer on the semiconductor substrate; a spacer on lateral sides of the gate; one or more junction regions In the semiconductor substrate at the sides of the gate; and an insulating layer over the semiconductor substrate and filling a full height of a gap between adjacent gates, having a contact hole therein partially exposing the junction region; and a silicon layer on an exposed portion of the junction region (at the bottom of the contact hole), partially filling the contact hole.

An exemplary method for manufacturing a semiconductor device according to an embodiment of the present Invention includes: forming an insulating layer over a semiconductor substrate having a gate insulating layer, a gate, and a spacer respectively formed thereabove and a junction region formed therein so as to fill a full height of a gap between adjacent gates; forming a contact hole partially exposing the junction region by etching the insulating layer; and selectively forming a silicon layer on an exposed portion of the junction region (at the bottom of the contact hole).

In a further embodiment, the silicon layer may be formed by epitaxial growth.

In a further embodiment, the Insulating layer may be etched such that the contact hole has an overcut profile.

In a further embodiment, a contact hole exposing the gate may also be formed while forming the contact hole partially exposing the junction region.

In a further embodiment, the silicon layer may be selectively formed by forming a mask exposing only the junction region.

DETAILED DESCRIPTION OF THE EMBODIMENTS

An embodiment of the present invention will hereinafter be described in detail with reference to the accompanying drawings.

Hereinafter, a method for forming a contact hole of a semiconductor device according to an exemplary embodiment of the present invention will be described in detail with reference to FIG. 3A to FIG. 3E.

Figure 3A:
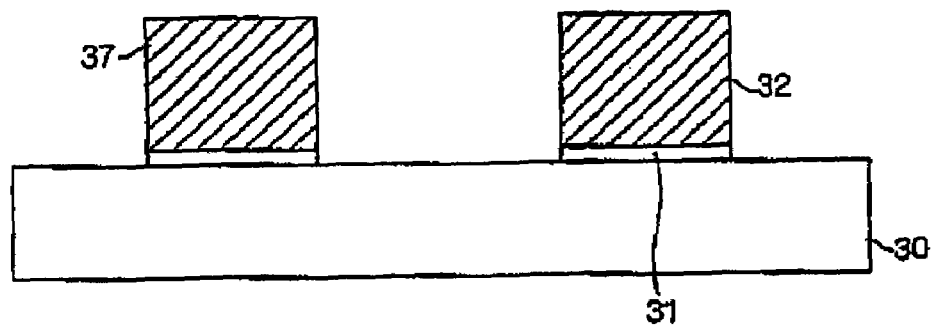
FIG. 3A to FIG. 3E are sectional views of FIG. 1 along a line A-A', showing sequential stages of a method for forming a contact hole of a semiconductor device according to an exemplary embodiment of the present Invention.
Figure 3B:
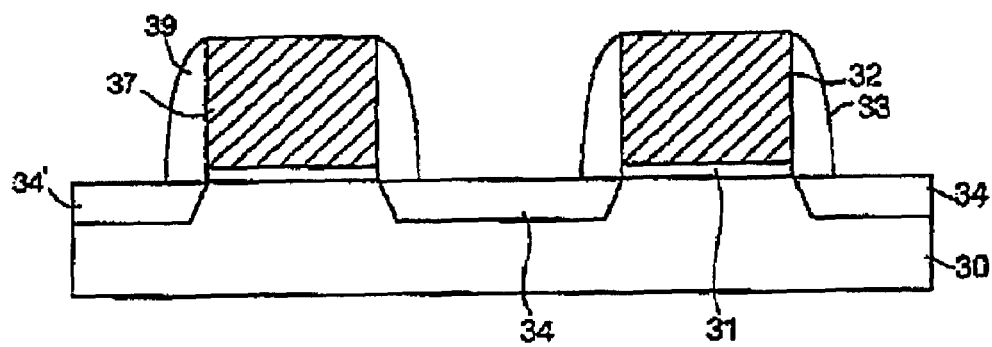

As shown in FIG. 3A, a gate insulating layer 31 comprising, e.g., a thermal silicon oxide is formed on a semiconductor substrate 30 comprising, e.g., silicon, and a gate material layer such as a polysilicon layer is then deposited on the insulating layer 31. Subsequently, a gate 32 (and an adjacent gate 37) may be formed by patterning the gate material layer by a photolithography and etching process.

As shown in FIG. 38, a spacer 33 comprising an insulating material is formed at each lateral side of the gate 32 (and an identical spacer 39 may be formed at the sides of the gate 37), and impurity ions are implanted into the substrate 30 so as to form source/drain junction regions 34 therein at the sides of the gate 32. In one alternative, prior to forming the spacers 33 and 39, conventional LDD regions may be formed in the substrate 30 by ion implantation.

Figure 3C:
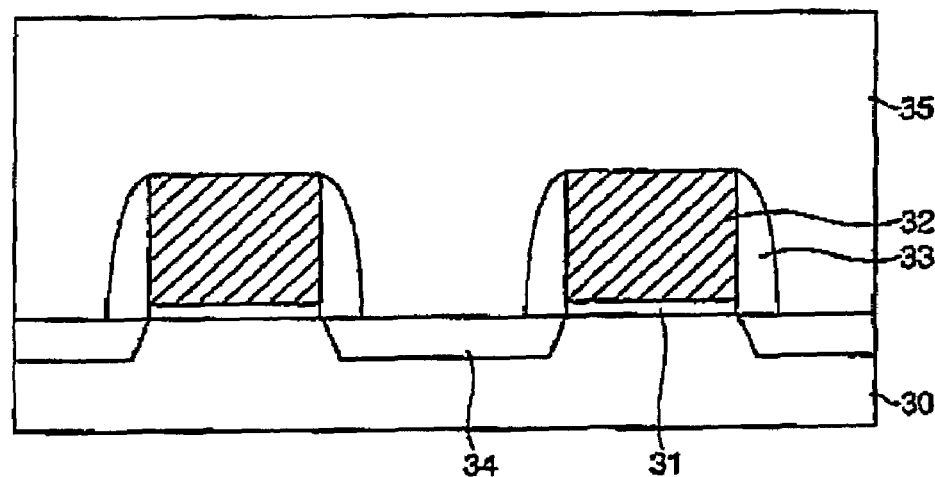

Subsequently, as shown in FIG. 3C, an Interlayer insulating layer 35 is formed on the substrate 30. Insulating layer 35 may comprise a flowable insulating layer, such as a BPSG layer or a PSG layer, such that the full height of the gap between the adjacent gates 32 and 37 may be completely filled.

Figure 3D:
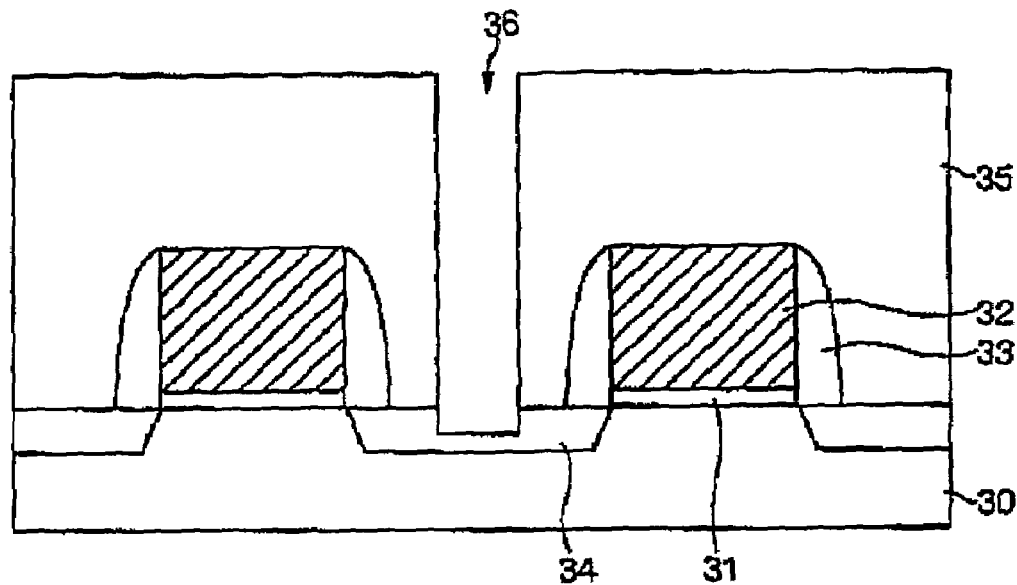

Subsequently, as shown in FIG. 3D, the interlayer insulating layer 35 is etched to form a contact hole 36 that partially exposes the junction region 34. At this time, the etching is performed such that the contact hole 36 has an overcut profile and becomes completely open.

Figure 1:
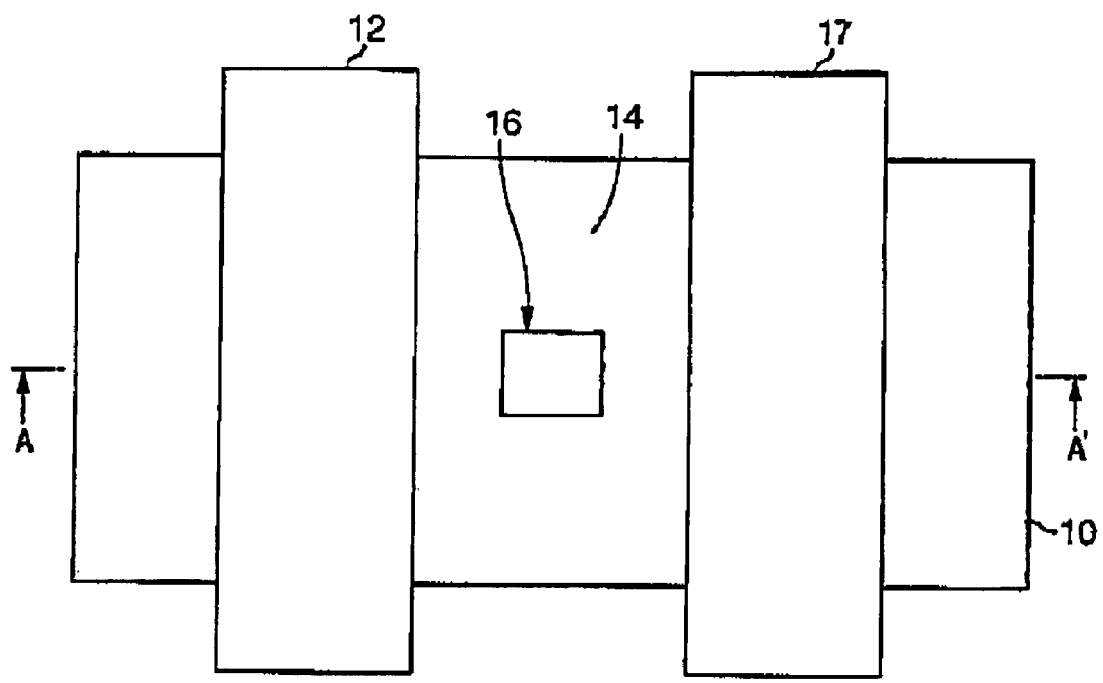
FIG. 1 is a top plan view of a semiconductor device after forming a contact hole according to a conventional method and according to an exemplary embodiment of the present invention.
Figure 2A:
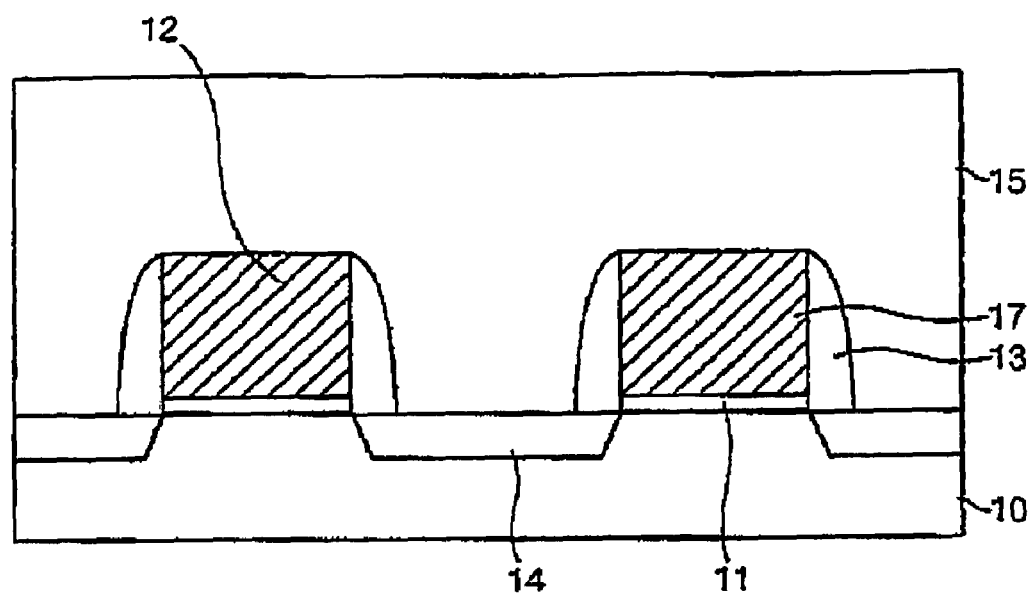
FIG. 2A and FIG. 2B are respectively sectional views of FIG. 1 along a line A-A' for a semiconductor device manufactured according to a conventional method.
Figure 2B:
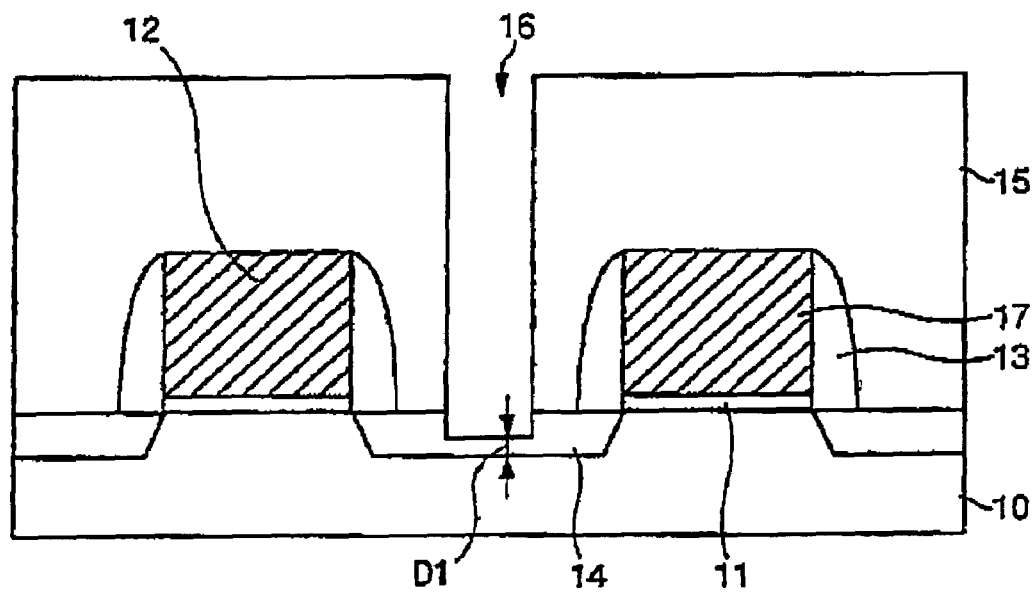
Figure 3E:
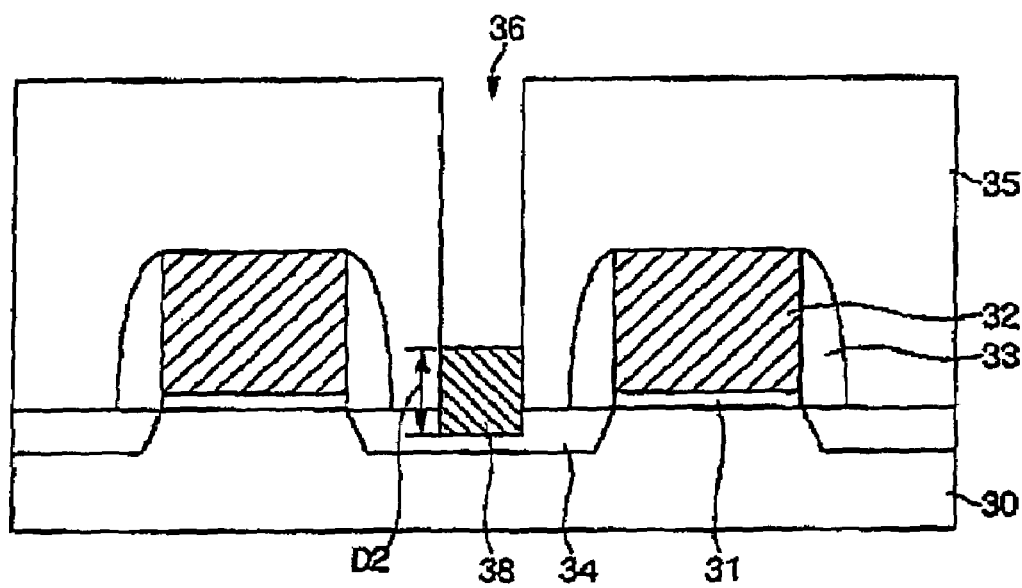

Subsequently, as shown in FIG. 3E, a silicon layer 38 is epitaxially to grown on the exposed junction region 34. Thus, in one embodiment, a sequential epitaxial growth (SEG) process is performed, thereby partially filling the contact hole 36 by selectively forming a silicon layer 38 only on an exposed portion of the junction region 34 at the bottom of the contact hole 36. That is, the silicon layer 38 is selectively formed only on the contact surface at the bottom of the contact hole 36, and thus the thickness from the contact surface at the bottom of the contact hole 36 to the bottom of the junction region 34 Increases to the level D2 from the conventional level D1 (refer to FIG. 2B), even if the junction region 34 has been partially etched according to the overcut profile. Therefore, the invention may reduce or prevent deterioration of a contact resistance characteristic of a wire contacting the junction region 34 through the contact hole 35 and the silicon layer 38.

As a variation of the above exemplary embodiment, in the case where an additional contact hole exposing the gate 32 is formed when forming the contact hole 36 exposing the junction region 34, the method may prevent formation of the silicon layer 38 on the gate 32 by using a mask opening the junction region 34 but blocking the gate 32 during the SEG process. Thus, the method may further comprise forming a mask blocking a second contact hole over the gate 32, but exposing the first contact hole over the junction region 34. Of course, any process step herein performed on a gate, spacer or junction region may be simultaneously performed on adjacent gates, spacers or junction regions.

As described above, according to an exemplary embodiment of the present invention, when a contact hole having an overcut profile has been formed to a junction region of a semiconductor device, a silicon layer Is selectively formed on a contact surface at a bottom of the contact hole. Thus, even when the contact hole has an overcut profile in order to fully open the contact hole, the thickness from a contact surface at a bottom of contact hole to a bottom of a junction region may become sufficient to enhance a contact resistance characteristic of a wire thereto. Consequently, the yield and/or reliability of a semiconductor device may be enhanced.

While this invention has been described in connection with what Is presently considered to be practical exemplary embodiments, it is to be understood that the invention is not limited to the disclosed embodiments, but, on the contrary, intended to cover various modifications and equivalent arrangements included within the spirit and scope of the appended claims.

What is claimed is:

1. A method for manufacturing a semiconductor device comprising:
   forming an insulating layer over a semiconductor substrate having a gate insulating layer, a gate, and a spacer thereabove and a junction region therein so as to fill a fill height of a gap between gates;
   forming a first contact hole partially exposing the junction region and a second contact hole exposing the gate by etching the insulating layer;
   overetching the insulating layer sufficiently to provide the first contact hole with an overcut profile; and
   selectively growing an epitaxial silicon layer on an exposed portion of the junction region at a bottom of the first contact hole using a mask exposing only the junction region.

2. A method for manufacturing a semiconductor device comprising:
   forming an insulating layer over a semiconductor substrate having a gate insulating layer, a gate, and a spacer thereabove and a junction region therein so as to fill a full height of a gap between gates;
   forming a first contact hole partially exposing the junction region and a second contact hole exposing the gate by etching the insulating layer; and
   selectively forming a silicon layer on an exposed portion of the junction region at a bottom of the first contact hole.

3. A method for manufacturing a semiconductor device comprising:
   forming an insulating layer over a semiconductor substrate having a gate insulating layer, a gate, and a spacer thereabove and a junction region therein so as to fill a full height of a gap between gates;
   forming a first contact hole partially exposing the junction region by etching the insulating layer;
   selectively forming a silicon layer on an exposed portion of the junction region at a bottom of the first contact hole using a mask exposing only the junction region.

4. The method of claim 2, wherein selectively forming the silicon layer comprises epitaxially growing the silicon layer.

5. The method of claim 2, wherein etching the insulating layer comprises overetching the insulating layer sufficiently to provide the first contact hole with an overcut profile.

6. The method of claim 3, wherein:
   selectively forming the silicon layer comprises epitaxially growing the silicon layer; and
   etching the insulating layer comprises overetching the insulating layer sufficiently to provide the first contact hole with an overcut profile.

7. The method of claim 3, wherein:
   selectively forming the silicon layer comprises epitaxially growing the silicon layer; and etching the insulating layer further comprises forming a second contact hole exposing the gate.

8. The method of claim 3, wherein etching the insulating layer comprises:

overetching the insulating layer sufficiently to provide the first contact hole with an overcut profile; and forming a second contact hole exposing the gate.

9. The method of claim 2, wherein:

forming the silicon layer comprises epitaxially growing the silicon layer; and etching the insulating layer comprises overetching the insulating layer sufficiently to provide the first contact hole with an overcut profile.

10. The method of claim 2, wherein selectively forming the silicon layer further comprises forming a mask exposing only the junction region.

11. The method of claim 1, further comprising forming a mask exposing only the junction region.

12. The method of claim 2, further comprising forming a mask exposing only the junction region.

13. The method of claim 1, further comprising forming the gate insulating layer, gate, and spacer on the semiconductor substrate, and forming a plurality of junction regions in the semiconductor substrate.

14. The method of claim 2, further comprising forming the gate insulating layer, gate, and spacer on the semiconductor substrate, and forming a plurality of junction regions in the semiconductor substrate.

15. The method of claim 3, further comprising forming the gate insulating layer, gate, and spacer on the semiconductor substrate, and forming a plurality of junction regions in the semiconductor substrate.

* * * * *